(12) United States Patent
Richmond et al.

(10) Patent No.: US 6,836,169 B2
(45) Date of Patent: Dec. 28, 2004

(54) SINGLE ENDED CLOCK SIGNAL GENERATOR HAVING A DIFFERENTIAL OUTPUT

(75) Inventors: Greg Richmond, Sunnyvale, CA (US); Ahmet Akyildiz, San Jose, CA (US); Alex Shkidt, Newark, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/327,217

(22) Filed: Dec. 20, 2002

(65) Prior Publication Data

US 2004/0119509 A1 Jun. 24, 2004

(51) Int. Cl.$^7$ ................................................ G05F 1/04
(52) U.S. Cl. ...................................... 327/291; 327/295
(58) Field of Search ................................. 327/291, 292, 327/295, 170, 172–176, 41, 43–45, 47, 49, 100–102, 199, 141–145

(56) References Cited

U.S. PATENT DOCUMENTS

| | | | | |
|---|---|---|---|---|
| 5,361,290 A | * | 11/1994 | Akiyama | 377/47 |
| 5,517,198 A | * | 5/1996 | McEwan | 342/89 |
| 5,867,046 A | * | 2/1999 | Sugasawa | 327/258 |
| 6,411,665 B1 | * | 6/2002 | Chan et al. | 375/360 |
| 6,614,374 B1 | * | 9/2003 | Gustavsson et al. | 341/143 |
| 6,636,096 B2 | * | 10/2003 | Schaffer et al. | 327/295 |

* cited by examiner

Primary Examiner—My-Trang Nu Ton
(74) Attorney, Agent, or Firm—Wagner, Murabito & Hao LLP

(57) ABSTRACT

Embodiments of the present invention provide for generating a sampled differential pattern signal with reduced jitter. In one embodiment of the present invention, a seed frequency generator provides a differential seed frequency signal. The differential seed frequency signal is converted to a single ended seed frequency signal by a differential-to-single ended converter. The pattern generation logic utilizes the single ended seed frequency signal to generate single ended pattern signals. Single ended-to-differential samplers then generate a sampled differential pattern signal by sampling the single ended pattern signal according to the differential seed frequency signal.

28 Claims, 4 Drawing Sheets

SINGLE ENDED CLOCK SIGNAL GENERATOR HAVING A DIFFERENTIAL OUTPUT

FIELD OF THE INVENTION

Embodiments of the present invention relate to clock signal generators, and more particularly to a differentially synchronized output clock signal produced by complementary or single ended pattern generation logic.

BACKGROUND OF THE INVENTION

A clock signal generator is commonly employed in a variety of applications, including communications and timing circuitry. Typically, a seed frequency is used to generate one or more clock signals. Desirable clock signal generators should have good noise suppression, low power consumption, and small fabrication area characteristics.

Referring to FIG. 1, a block diagram of a pattern generator 100 in accordance with the conventional art is shown. The pattern generator 100 comprises a seed frequency generator 110, a differential-to-single ended converter 120, and pattern generation logic 130. The seed frequency generator 110 typically provides a differential seed frequency signal 140. The differential seed frequency signal 140 is then converted to a single ended seed frequency signal 150 by the differential-to-single ended converter 120. The pattern generation logic 130 receives the single ended seed frequency signal 150 and generates one or more single ended pattern signals 160 based thereupon. Hence, the circuit realizes a method of providing a single ended pattern signal 160 from a differential seed frequency signal 140.

The single ended pattern generation logic 130 typically triggers on an edge of the seed frequency signal. The triggering event occurs when the falling and/or rising edge passes a threshold value. In physical implementations the threshold value moves in accordance with noise present on the power supply. A practical single ended seed frequency signal 150 also has a finite rise and fall time. Thus, when a single ended seed frequency signal 150 having a finite rise and/or fall time passes through a threshold point which is moving in accordance with noise present on the power supply, the trigger events are shifted in time, which results in jitter on the single ended pattern signal 160. Thus, even if a single ended signal has a perfect waveform shape, jitter is created. Similarly, if the threshold value does not move, but the single ended seed frequency signal 150 has a noisy waveform shape, jitter is also created.

Jitter may also result from trace-coupled noise, and the like. A single ended pattern signal 160 originating from the differential seed frequency generator 110 also suffers from noise coupling in the differential-to-single ended converter 120. Single ended signal 150, 160 paths are also susceptible to noise coupling. In addition, single ended signals 150, 160 crossing power supply boundaries incur jitter due to shifting signal levels and threshold values. Hence, the single ended pattern signal 160 is disadvantageous in that the single ended pattern signal 160 is sensitive to noise.

Referring now to FIG. 2, a block diagram of another pattern generator 200 in accordance with the conventional art is shown. The pattern generator 200 comprises a seed frequency generator 210 and pattern generation logic 220. The seed frequency generator 210 provides a differential seed frequency signal 230. The pattern generation logic 220 receives the differential seed frequency signal 230 and generates a differential pattern signal 240 based thereupon. Hence, the circuit realizes a method of providing a differential pattern signal 240 from a differential seed frequency signal 230.

Differential signals effectively carry their own reference signal. The inherent reference signal is utilized to reject common mode noise and thus reduce the deviation of triggering events from their intended periodic occurrence in time. Therefore, the differential pattern generation logic 220 significantly reduces the amount of jitter generated from system noise. The differential pattern signal 240 path also allows for common mode rejection of noise coupled on the differential pattern signal 240 path. However, this method is disadvantageous in that differential circuits requires more power and occupy a larger fabrication area than single ended circuits. They are also more complex to design and build thereby increasing cost.

Referring now to FIG. 3, another pattern generator 300 in accordance with the conventional art is shown. The pattern generator 300 comprises a seed frequency generator 310, a differential-to-single ended converter 320, pattern:generation logic 330, a transmission gate 370 and an inverter 375. The seed frequency generator 310 provides a differential seed frequency signal 340. The differential seed frequency signal 340 is then converted to a single ended seed frequency signal 350 by the differential-to-single ended converter 320. The pattern generation logic 330 receives the single ended seed frequency signal 350 and generates a single ended pattern signal 360 based thereupon. A complimentary, pseudo differential, pattern signal 380 is then generated by passing the single ended pattern signal 360 through the inverter 375. The transmission gate 370 is utilized to match the propagation delay introduced by the inverter 375. Hence, the circuit realizes a method of providing a complimentary pattern signal 380 from a differential seed frequency signal 340.

The complimentary, pseudo differential, circuit requires less power and occupies a smaller area. The complimentary signal also provides the ability to reject common mode noise coupled on the complimentary pattern signal 380 path. However, this method is disadvantageous in that the complimentary, pseudo differential, pattern signal 380 is difficult to control and typically is not exactly 180° out of phase and therefore suffers from noise induced jitter. In addition, the jitter from the pattern generation logic is not removed, because the pattern generation logic is single ended.

SUMMARY OF THE INVENTION

Embodiments of the present invention provide a novel pattern generator, including circuitry for generating a sampled differential pattern signal. In one embodiment of the present invention, a differential seed frequency signal is converted to a single ended seed frequency signal. The single ended seed frequency signal is then used to generate a single ended pattern signal. A sampled differential pattern signal is then generated by sampling the single ended pattern signal according to the differential seed frequency signal.

In another embodiment of the present invention, a differential seed frequency signal is utilized to sample a complimentary pattern signal and convert it to a sampled differential pattern signal. By generating the sampled differential pattern signal in this fashion, a differential clock signal having reduced jitter is generated, while the clock pattern can be generated with single ended logic.

In another embodiment of the present invention, a first output of a voltage controlled oscillator generates a single ended seed frequency signal, which is fed to a divider circuit. The divider circuit generates a first complimentary signal, which is fed to the data input of a differential flip-flop circuit. A second output of the voltage controlled oscillator generates a differential seed frequency signal, which is fed to the sample clock of the differential flip-flop. The output of the differential flip-flop is then supplied to a buffer circuit.

By sampling the first complimentary signal using the differential seed frequency signal, data jitter is substantially eliminated in a resulting sampled differential signal. Therefore, any Boolean function performed on clock signals in order to generated the output clock signal can be done using single ended logic and then converted to fully differential form for better noise suppression. The seed frequency generator supplies a fully differential trigger timing event to the differential sampler. Thus, the same timing performance is achieved as if the entire circuit was differential.

Embodiments of the present invention are advantageous in that a sampled differential pattern signal path is less sensitive to supply and trace coupled noise and the like. Embodiments of the present invention are also advantageous in that the sampled differential pattern signal exhibits reduced jitter compared to single ended and complimentary, pseudo differential, clock signal generation methods. Embodiments of the present invention are also advantageous in that conversion of single ended signals to sampled differential signals allows the seed frequency signal and output clock signal to be entirely differential, while utilizing single ended pattern generation logic for lower power and less area. Embodiments of the present invention are also advantageous in that multiple patterns can be sampled from the same seed frequency generator. Embodiments of the present invention are also advantageous in that circuits generating multiple patterns can have a common supply without suffering from noise coupling.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1:
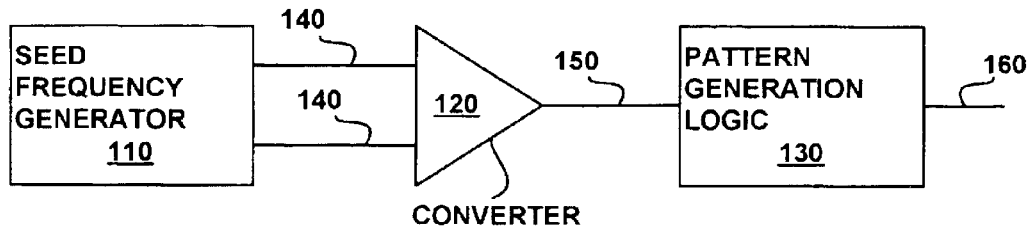
FIG. 1 shows a block diagram of a clock signal generator in accordance with the conventional art.
Figure 2:
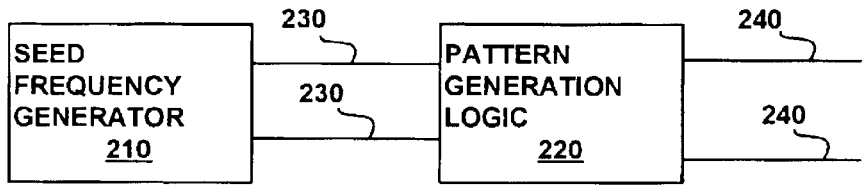
FIG. 2 shows a block diagram of another clock signal generator in accordance with the conventional art.
Figure 3:
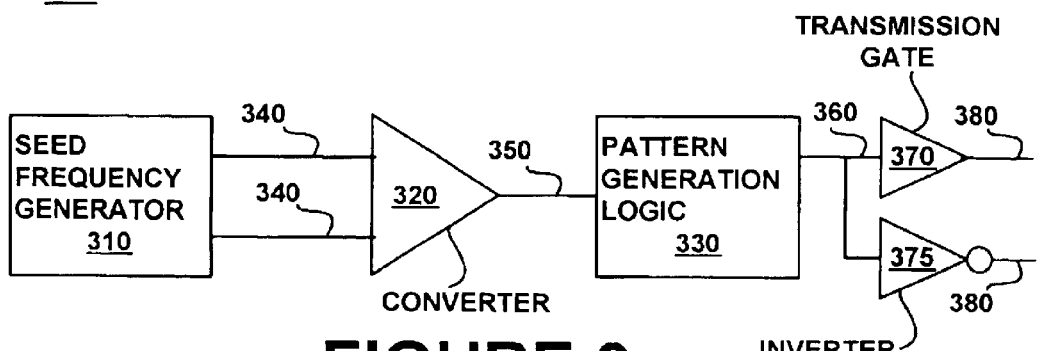
FIG. 3 shows a block diagram of another clock signal generator in accordance with the conventional art.
Figure 4:
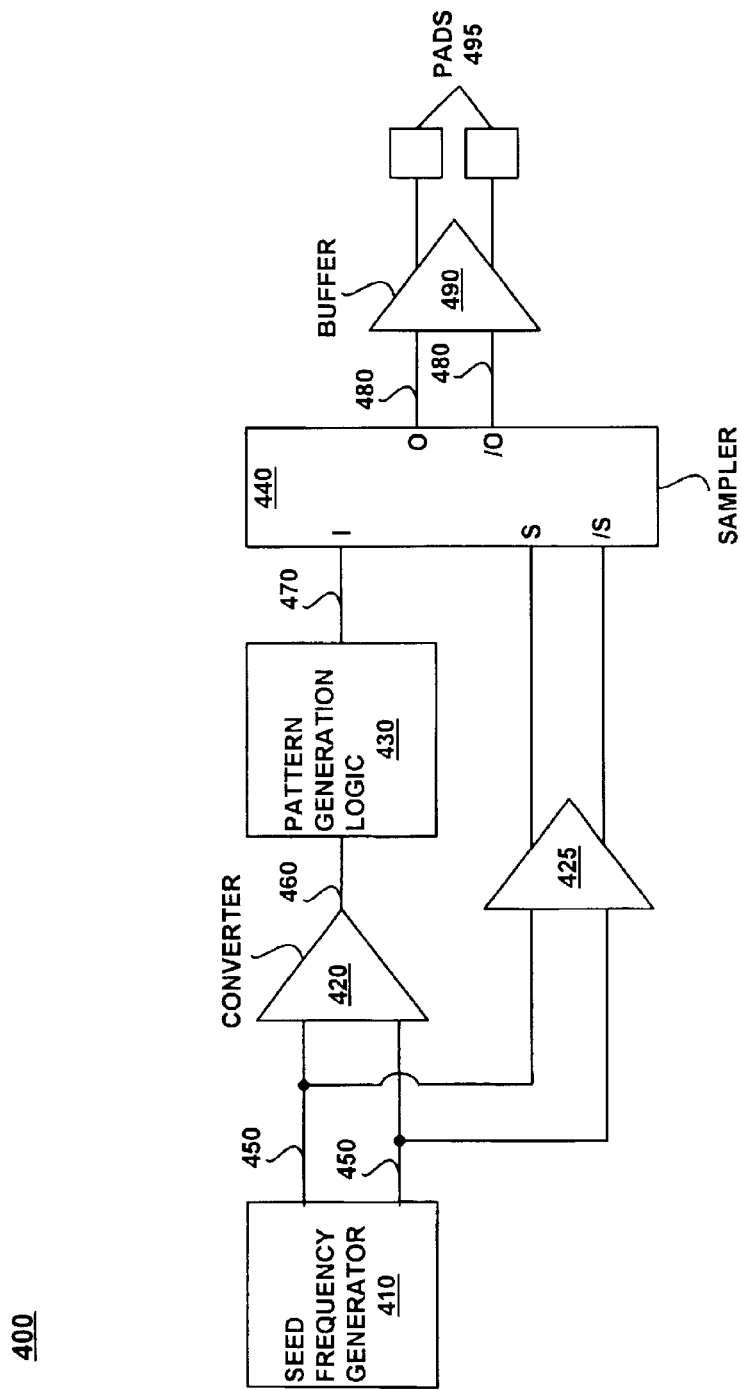
FIG. 4 shows a block diagram of a clock signal generator in accordance with one embodiment of the present invention.

Referring now to FIG. 4, a block diagram of an exemplary pattern generator 400 in accordance with one embodiment of the present invention, is shown. As depicted in FIG. 4, the pattern generator 400 comprises a seed frequency generator 410, a differential-to-single ended converter 420, pattern generation logic 430, and a single ended-to-differential sampler 440, which could be a flip-flop circuit. The seed frequency generator 410, which may be a phase lock loop circuit for instance, provides a differential seed frequency signal 450. The differential seed frequency signal 450 is converted to a single ended seed frequency signal 460 by the differential-to-single ended converter 420. The pattern generation logic 430, which may be a divider circuit for instance, then converts the single ended seed frequency signal 460 to a single ended pattern signal 470 having desired characteristics such as frequency, duty cycle, phase, and the like. The pattern generation logic 430 may be a programmable circuit for producing a number of different, programmable single ended pattern signals at 470.

One or more delay matching differential buffer 425 may also be used to match the delay through the differential-to-single ended converter 420 and the pattern generation logic 430, thus maintaining proper setup and hold time at the single ended-to-differential sampler 440. Thereafter, the single ended-to-differential sampler 440 receives the single ended pattern signal 470 at a first input (I), and the buffered differential seed frequency signal 455 at a second input (S and /S). At the crossing point of the buffered differential seed frequency signal 450, the state of the signal at the first input (I) (e.g., the single ended pattern signal 470) and its compliment are latched at an output (O and /O). The differential signal across the output (O and /O) comprises the sampled differential pattern signal 480.

In an optional implementation of the present invention, a buffer 490 may be utilized to buffer the sampled differential pattern signal 480 across the output (O and /O). The buffer 490 provides for driving circuits connected to the output pads 495 of the pattern generator 400.

In the present embodiment, the pattern generation logic 430 is single ended and therefore requires less power and less area. In addition, use of the differential path from the seed frequency signal 450 path through the differential buffers 425 to sample the synchronous single ended pattern signal 470, results in less jitter on the sampled differential pattern signal 480. Noise present on the sampled differential pattern signal 480 also tends to be common mode noise, such as supply and trace coupled noise. Thus, common mode noise rejection methods well known in the conventional art can be utilized to reject noise present on the sampled differential pattern signal 480 path. Furthermore, any Boolean function performed on the sampled differential pattern signal 480, to generate control signals for example, may be done in fully differential form for better noise suppression.

Figure 5A:
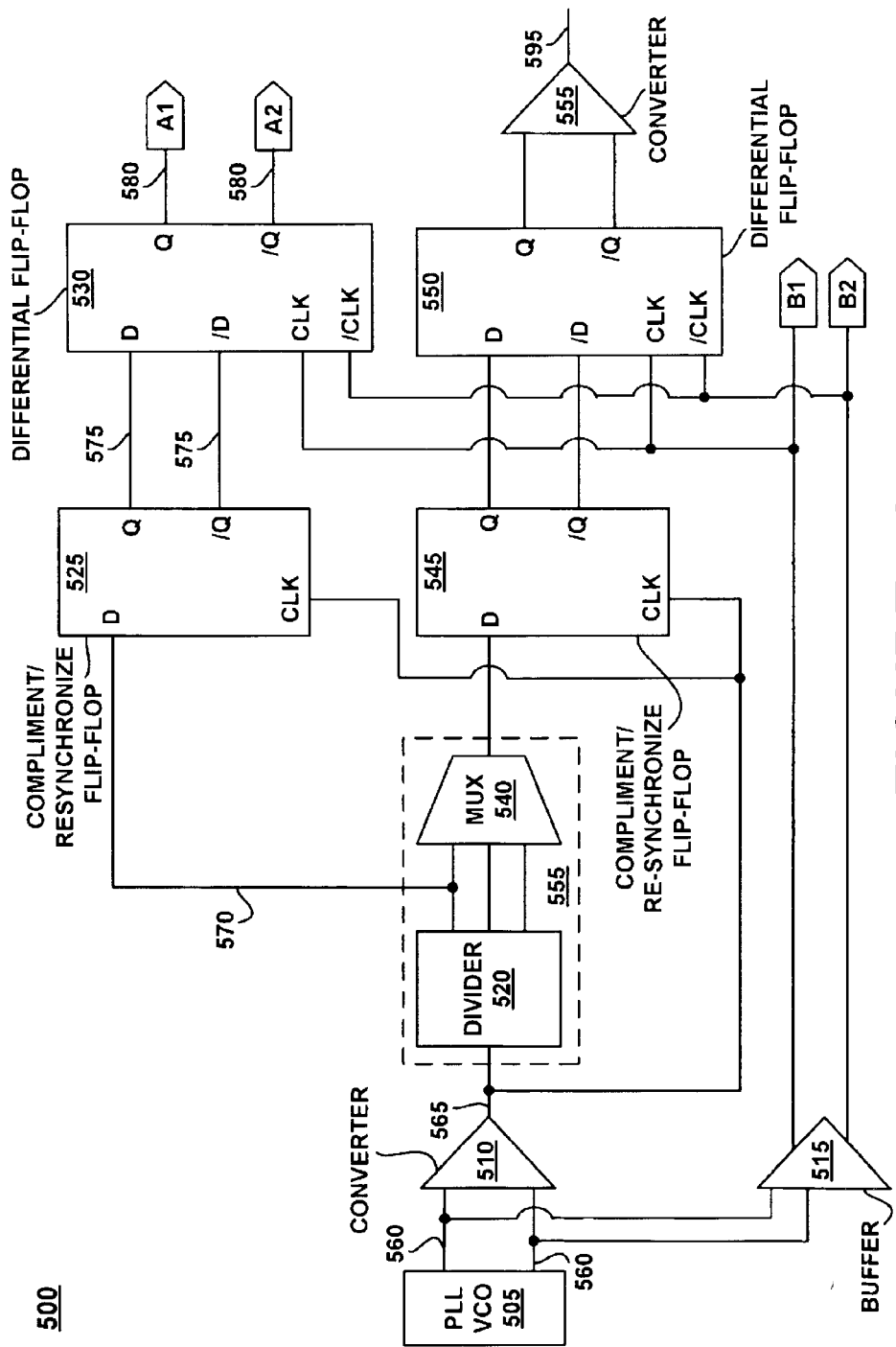
FIGS. 5A–5B show a block diagram of a clock signal generator in accordance with another embodiment of the present invention.
Figure 5B:
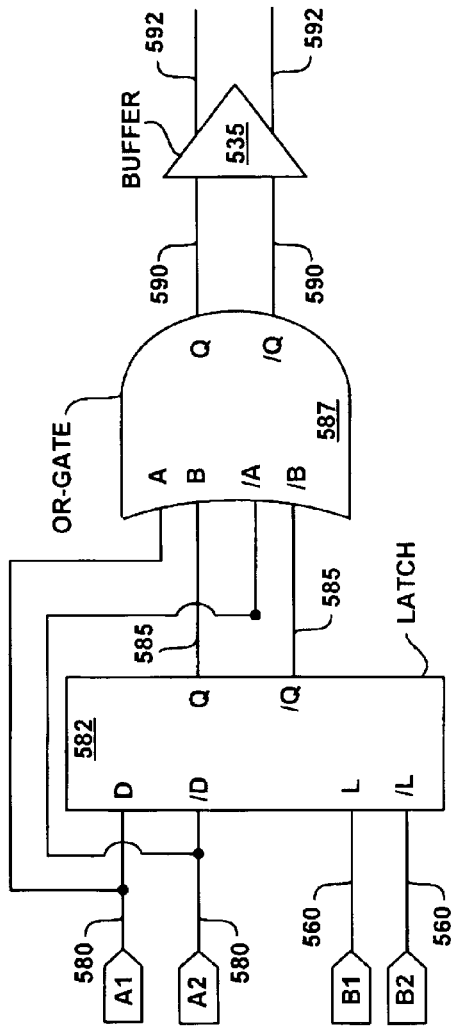

Referring now to FIGS. 5A–5B, a block diagram of a pattern generator 500 in accordance with another embodiment of the present invention, is shown. As depicted in FIGS. 5A–5B, the pattern generator 500 comprises a seed frequency generator 505, a differential-to-single ended converter 510, a differential buffer 515, pattern generation logic 555, a compliment/re-synchronize flip-flop 525, AND a single ended-to-differential sampler 530.

In an exemplary implementation, the seed frequency generator 505 may comprise a phase lock loop voltage controlled oscillator (PLL VCO), or the like. The pattern generator logic 555 may comprise a divider 520, and/or the combination of a divider and a multiplexer 540, or the like. Furthermore, the single ended-to-differential sampler 530 may comprise a differential flip-flop, or the like.

In an optional implementation of the present invention, the divider 520 having multiple divided outputs (e.g., divide by 2, 3, 4, 5, ... 17, ... or the like) and a multiplexer 565 can be combined to realize a selectable divider.

The phase lock loop voltage controlled oscillator 505 generates a differential seed frequency signal 560 (e.g., 0–1V at 1.0 GHz). The differential seed frequency signal 560 is supplied to the differential-to-single ended converter 510, wherein the differential seed frequency signal 560 is converted to a single ended seed frequency signal 565 (e.g., 0–3.3V at 1.0 GHz).

The single ended seed frequency signal 565 is supplied to the divider 520. The divider 520 reduces the frequency of the single ended seed frequency signal 565 to produce a single ended pattern signal 570 (e.g., divide by 10 to obtain 100 MHz). In an optional feature, the compliment/re-synchronize flip-flop 525 may be utilized to re-synchronize the single ended pattern signal 570 to the single ended seed frequency signal 565 by clocking the compliment/re-synchronize flip-flop 525 with the single ended seed frequency signal 565. The compliment/re-synchronize flip-flop 525 may also be utilized to provide for the necessary set-up and hold time required by the differential flip-flop 530. The re-synchronized single ended pattern signal 575 from the compliment/re-synchronize flip-flop 525 may be provided as a single ended signal (not shown) or as a re-synchronized complementary pattern signal.

The re-synchronized complimentary pattern signal 575 (or re-synchronized single ended pattern signal) is supplied to the differential flip-flop 530. The differential flip-flop 530 also receives the differential seed frequency signal 560. In another option feature, a buffer 515 may be utilized to buffer the differential seed frequency signal 560 thus providing for fan-out of the differential seed frequency signal 560 to multiple circuit elements (e.g., 530 550). In one implementation the buffer 515 may comprise one or more delay matching differential buffers. The differential buffers may be utilized to match the delay through the differential-to-single ended converter 510 and the pattern generation logic 555, thus maintaining proper setup and hold time at the single ended-to-differential samplers 530, 550.

The differential flip-flop 530 samples the re-synchronized complimentary pattern signal 575 at each crossing of the differential seed frequency signal 560 and thus provides a sampled differential pattern signal 580. The differential flip-flop 530 triggers relative to when the CLK and /CLK signals cross (e.g., the differential seed frequency signal 560). Common mode noise present on the differential signal path causes the two signals to vary equally and in the same direction. Therefore, the time at which the triggering event occurs does not change. Thus, the differential flip-flop does not introduce jitter onto the sampled differential pattern signal 580. The differential flip-flop 530 also removes noise and jitter introduced by the compliment/re-synchronize flip-flop 525, and/or the divider 520, and/or multiplexer 540, and/or the differential-to-single ended converter 510. Furthermore, multiple sampled differential pattern signals 580, 595 may be generated from a single phase lock loop voltage controlled oscillator 505 without suffering from cross-coupled noise.

In another implementation of the present invention, a converter 555 may be utilized to convert the sampled differential pattern signal to a sampled single ended pattern signal 595. The implementation still reduces jitter on the sampled single ended pattern signal 595. The reduction in jitter is a result of the fact that the jitter associated with the pattern generation logic 555 and compliment/re-synchronize flip-flop 525 is removed when the resynchronized single ended pattern signal 575 is sampled using the differential seed frequency signal 565.

In yet another implementation of the present invention, pulse stretching may be implemented to achieve a 50% duty cycle when an odd divide is performed by the divider 520. The sampled differential pattern signal 580 is supplied to a latch 582. The latch 582 also receives the differential seed frequency signal 560. The latch 582 provides a latched sampled differential pattern signal 585. An or-gate receives the sampled differential pattern signal at a first input and the latched sampled differential pattern signal at a second input. As a result, a differential clock, having a 50% duty cycle, is provided. In another optional feature, the sampled differential pattern signal 590, having a 50% duty cycle, may be buffered 535 to provide for fan-out of the sampled differential pattern signal 580.

Figure 6:
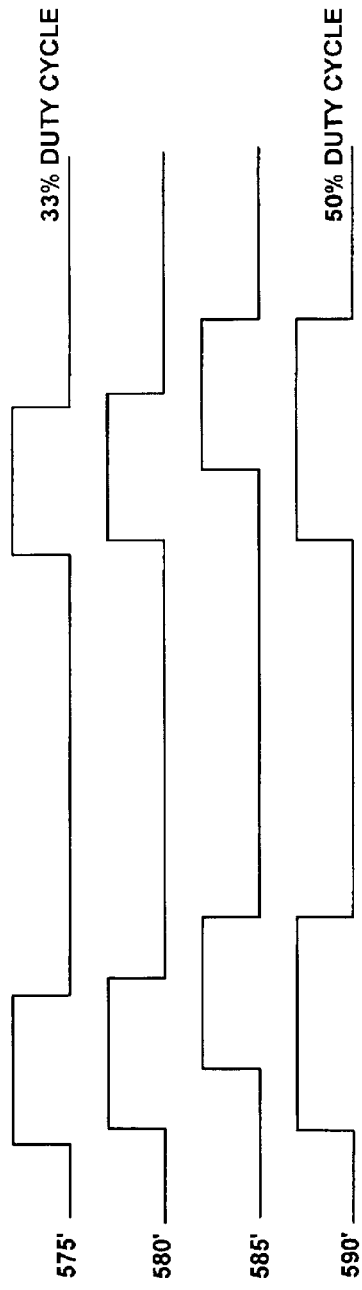
FIG. 6 shows a timing diagram of various nodes of the pulse stretching circuit, in accordance with one embodiment of the present invention.

Referring now to FIG. 6, timing diagram of various nodes of the pulse stretching circuit, in accordance with one embodiment of the present invention is shown. As depicted in FIG. 6, with reference to FIG. 5, the sampled differential pattern signal 580', on a rising edge, causes the signal at the output of the pulse stretching or-gate 590' to transition high in response to a high re-synchronized complimentary pattern signal 575'. The latched sampled differential pattern signal 585', on a falling edge, causes the signal at the output of the pulse stretching or-gate 590' to transition low in response to a low re-synchronized complimentary pattern signal 575'. Thus, a differential clock 590', having a 50% duty cycle, is provided.

Embodiments of the present invention are advantageous in that the best of differential signal paths and single ended signal paths are combined. The pattern generation logic 555 is single ended to reduce power consumption and fabrication area. The single ended-to-differential sampler 530 provides for removal of jitter introduced by the pattern generation logic 520, 540. The sampled differential pattern signal is provided as a differential signal allowing for common mode noise rejection.

It is appreciated that numerous well-known clock signals and circuits for generating patterns can be adapted to embodiments of the present invention, whereby the pattern generation logic is single ended and the output clock signals are sampled by differential signals and output as differential pattern signals.

The advantageous noise, power and area characteristics of embodiments of the present invention are independent of the logic family used to fabricate the circuits. However, the advantageous characteristics of embodiments of the present invention are enhanced when implemented using a logic family having enhanced noise suppression, low power consumption, and small fabrication area characteristics, such as complimentary metal oxide semiconductor (CMOS), bipolar CMOS (BiCMOS), or the like.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A pattern generator comprising:
   a converter for converting a differential seed frequency signal to a single ended seed frequency signal;
   a pattern generation logic coupled to said converter and for generating a single ended pattern signal from said single ended seed frequency signal; and
   a single-to-differential sampler coupled to said pattern generation logic and for generating a sampled differential pattern signal based on said single ended pattern signal, wherein said single-to-differential sampler is clocked by a differential clock signal.

2. The pattern generator according to claim 1, further comprising a seed frequency generator coupled to said converter and for providing said differential seed frequency signal.

3. The pattern generator according to claim 2, wherein said pattern generation logic is a low power circuit and wherein said differential seed frequency signal is generated by said seed frequency generator.

4. The pattern generator according to claim 1, wherein noise present on said single ended pattern signal is reduced in said sampled differential pattern signal.

5. The pattern generator according to claim 1, wherein said sampled differential pattern signal generated by said single-to-differential sampler is substantially jitter free.

6. The pattern generator according to claim 1, wherein said pattern generation logic reduces fabrication area occupied by said pattern generator.

7. A pattern generator comprising:
   a single ended pattern generation logic generating a single ended pattern signal from a single ended seed frequency signal;
   a differential flip-flop coupled to said single ended pattern generation logic, wherein a sampled differential pattern signal is generated by said differential flip-flop by sampling said single ended pattern signal according to a differential seed frequency signal; and
   a re-synchronization flip-flop coupled between said single ended pattern generation logic and said differential flip-flop, wherein said single ended pattern signal is re-synchronized by said re-synchronization flip-flop to said single ended seed frequency signal.

8. The pattern generator according to claim 7, further comprising a complimentary flip-flop coupled between said single ended pattern generation logic and said differential flip-flop, wherein said single ended pattern signal is converted by said complimentary flip-flop to a complimentary single ended clock signal.

9. The pattern generator according to claim 7, further comprising a phase lock loop voltage controlled oscillator coupled to said single ended pattern generation logic.

10. The pattern generator according to claim 9, further comprising a converter coupled between said phase lock loop voltage controlled oscillator and said single ended pattern generation logic, wherein a differential seed frequency signal is converted by said converter to said single ended seed frequency signal and wherein said phase lock loop voltage controlled oscillator also generates said differential seed frequency signal.

11. The pattern generator according to claim 7, wherein jitter on said sampled differential pattern signal is reduced.

12. The pattern generator according to claim 7, further comprising:
    a latch couple to said sampled differential pattern signal and for generating a latched sampled differential pattern signal, wherein said sampled differential pattern signal is latched by said differential clock signal; and
    an or-gate coupled to said sampled differential pattern and said latched sampled differential pattern signal and generating a fifty percent duty cycle sampled differential pattern signal.

13. The pattern generator according to claim 7, further comprising a second converter, wherein said sampled differential pattern signal is converted by said second converter to a sampled single ended pattern signal.

14. A method of generating a reduced jitter signal comprising:
    converting a differential seed frequency signal to a single ended seed frequency signal;
    generating a single ended pattern signal from said single ended seed frequency signal; and
    converting said single ended pattern signal to a sampled differential pattern signal by sampling said single ended pattern signal at a transition crossing of said differential seed frequency signal.

15. The method of claim 14, further comprising generating said differential seed frequency signal.

16. The method of claim 14, wherein jitter present on said single ended pattern signal is reduced in said sampled differential pattern signal by sampling based upon said single ended seed frequency.

17. The method of claim 14, further comprising re-synchronizing said single ended pattern signal to said single ended seed frequency signal.

18. The method of claim 14, further comprising converting said single ended pattern signal to a complimentary single ended clock signal.

19. The method of claim 14, further comprising:
    latching said sampled differential pattern signal as a function of said differential clock signal; and
    generating a fifty percent duty cycle sampled differential pattern signal as a function of said sampled differential pattern signal and said latched sampled differential pattern signal.

20. The method of claim 14, further comprising converting said sampled differential pattern signal to a sampled single ended pattern signal.

21. A pattern generator comprising:
    a converter having a first and second input for receiving a differential seed frequency signal;
    a pattern generation logic having a first input coupled to an output of said converter;
    a differential flip-flop having a first input coupled to an output of said pattern generation logic, having a differential clock input for receiving said differential seed frequency signal, and wherein a sampled differential pattern signal is output at a first and second output of said differential flip-flop.

22. The pattern generator according to claim 21, further comprising a compliment re-synchronize flip-flop having a first input coupled to said output of said pattern generation logic, having a clock input coupled to said output of said converter, having a first output coupled to said first input of said differential flip-flop and having a second output coupled to said second input of said differential flip-flop.

23. The pattern generator according to claim 21, further comprising:

a latch having a first input coupled to said first output of said differential flip-flop, having a second input coupled to said second output of said differential flip-flop, having a third and fourth input for receiving said differential seed frequency signal; and an or-gate having a first input coupled to said first output of said differential flip-flop, having a second input coupled to a first output of said latch, having a third input coupled to said second output of said differential flip-flop, having a fourth input coupled to a second output of said latch, and wherein a sampled differential pattern signal having a stretched pulse is output at a first and second output of said or-gate.

24. A pattern generator comprising:

a single ended pattern generation logic generating a single ended pattern signal from a single ended seed frequency signal;

a differential flip-flop coupled to said single ended pattern generation logic, wherein a sampled differential pattern signal is generated by said differential flip-flop by sampling said single ended pattern signal according to a differential seed frequency signal;

a latch couple to said sampled differential pattern signal and for generating a latched sampled differential pattern signal, wherein said sampled differential pattern signal is latched by said differential clock signal; and an or-gate coupled to said sampled differential pattern and said latched sampled differential pattern signal and generating a fifty percent duty cycle sampled differential pattern signal.

25. The pattern generator according to claim 24, further comprising a complimentary flip-flop coupled between said single ended pattern generation logic and said differential flip-flop, wherein said single ended pattern signal is converted by said complimentary flip-flop to a complimentary single ended clock signal.

26. The pattern generator according to claim 24, further comprising a re-synchronization flip-flop coupled between said single ended pattern generation logic and said differential flip-flop, wherein said single ended pattern signal is re-synchronized by said re-synchronization flip-flop to said single ended seed frequency signal.

27. The pattern generator according to claim 24, further comprising:

a phase lock loop voltage controlled oscillator for generating said differential seed frequency signal; and a converter coupled between said phase lock loop voltage controlled oscillator and said single ended pattern generation logic for converting said differential seed frequency signal to said single ended seed frequency signal.

28. The pattern generator according to claim 24, further comprising a converter, wherein said sampled differential pattern signal is converted by said converter to a sampled single ended pattern signal.

* * * * *